United States Patent
Nguyen et al.

(10) Patent No.: US 7,151,010 B2
(45) Date of Patent: Dec. 19, 2006

(54) METHODS FOR ASSEMBLING A STACK PACKAGE FOR HIGH DENSITY INTEGRATED CIRCUITS

(75) Inventors: Cam T. Nguyen, San Diego, CA (US); Sherry Xiaoqi Zhu, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 0 days.

(21) Appl. No.: 11/051,341

(22) Filed: Feb. 4, 2005

(65) Prior Publication Data

US 2006/0115928 A1 Jun. 1, 2006

Related U.S. Application Data

(63) Continuation-in-part of application No. 11/002,480, filed on Dec. 1, 2004.

(51) Int. Cl.
*H01L 21/44* (2006.01)

(52) U.S. Cl. .................. 438/107; 257/E25.031

(58) Field of Classification Search .............. 438/5, 438/7, 10–11, 14, 16–18, 22–24, 29, 31, 34–36, 438/128–130, 149, 484, 538; 700/99–120
See application file for complete search history.

(56) References Cited

U.S. PATENT DOCUMENTS

| | | | |
|---|---|---|---|
| 5,057,441 A * | 10/1991 | Gutt et al. ................ 438/11 |
| 5,783,870 A | 7/1998 | Mostafazadeh et al. | |
| 6,288,347 B1 | 9/2001 | Nakagawa et al. | |
| 6,564,454 B1 | 5/2003 | Glenn et al. | |
| 6,599,774 B1 | 7/2003 | Hultmark et al. | |
| 6,881,607 B1 * | 4/2005 | Farnworth ................ 438/106 |
| 7,009,297 B1 * | 3/2006 | Chiang et al. ............ 257/738 |
| 2001/0036748 A1 | 11/2001 | Rutter et al. | |
| 2002/0001670 A1 * | 1/2002 | Pauw et al. ................ 427/98 |
| 2003/0156454 A1 | 8/2003 | Wei et al. | |
| 2004/0038450 A1 * | 2/2004 | King et al. ................ 438/107 |
| 2004/0145054 A1 | 7/2004 | Bang et al. | |
| 2004/0180471 A1 | 9/2004 | Matsuura et al. | |
| 2005/0009259 A1 * | 1/2005 | Farnworth ................ 438/200 |
| 2005/0104196 A1 | 5/2005 | Kashiwazaki | |
| 2006/0057773 A1 * | 3/2006 | Gross ..................... 438/107 |

\* cited by examiner

*Primary Examiner*—Michael Lebentritt
*Assistant Examiner*—Andre' Stevenson (57) ABSTRACT

Methods for assembling a stack package for a high density IC module on a PCB include the steps of assembling a first layer of the stack package on the PCB, assembling a second layer of the stack package on the first layer and assembling a third layer of the stack package on the second layer, such that each layer is provided in electrical communication with the PCB. Additional layers may be added to the stack package.

18 Claims, 4 Drawing Sheets

METHODS FOR ASSEMBLING A STACK PACKAGE FOR HIGH DENSITY INTEGRATED CIRCUITS

CROSS REFERENCE TO RELATED APPLICATIONS

This application is a continuation-in-part of U.S. patent application Ser. No. 11/002,480, filed Dec. 1, 2004, the contents of which are incorporated herein by reference in their entirety.

FIELD OF THE INVENTION

The present invention relates generally to systems and methods for assembling integrated circuit (IC) stack packages.

BACKGROUND OF THE INVENTION

Electronic package designs for today's high speed electronic systems (e.g., computers, cell phones, network devices, etc.) must provide quality electrical performance and reliable electronic connections between various system components such as cards, chips, boards, modules, etc. Additionally, these electronic connections are often manufactured to be as dense as possible such that they use the least possible amount of space on the printed circuit board (PCB).

Most modern software applications require enormous amounts of volatile random access memory (RAM) at increasingly high speeds. The maximum operating speed of a memory system is determined in large part by the electrical connections between the memory devices and the memory controller. The total amount of memory available on a system is determined by the capacity of the memory devices, the number of electrical connections on the memory devices and the amount of space available to support additional memory devices.

SUMMARY OF THE INVENTION

The present invention provides stack packages for high density application specific integrated circuits (ASIC's) and memory modules that effectively reduce PCB size. A PCB usually contains a plurality of layers, the densest of which is the interconnection between the application specific integrated circuits (ASIC) and the memory chips. An objective of the present invention is to remove such high density PCB layers and instead use interposers to stack these components. Stacking provides a much more efficient use of PCB space.

A stack package according to the principles of the present invention includes a routing interposer disposed between the IC, commonly an ASIC, and another chip, such as a memory chip. The interposer functions as a translator between the ASIC and memory and may replace hundreds of lines between the ASIC and the memory. Advantageously, the interposer can be used with known chips (e.g., ASIC ) such that one does not have to design a new chip with unknown results. The interposer could be either an individual piece or a substrate carrier for memory or an ASIC.

Methods for assembling a stack package for a high density IC module on a PCB are also provided. Such methods include the steps of assembling a first layer of the stack package on the PCB, assembling a second layer of the stack package on the first layer and assembling a third layer of the stack package on the second layer, such that each layer is provided in electrical communication with the PCB. Additional layers may be added to the stack package.

These and other features and advantages of the present invention will be appreciated from review of the following detailed description of the invention, along with the accompanying figures in which like reference numerals refer to like parts throughout.

DETAILED DESCRIPTION

Figure 1:
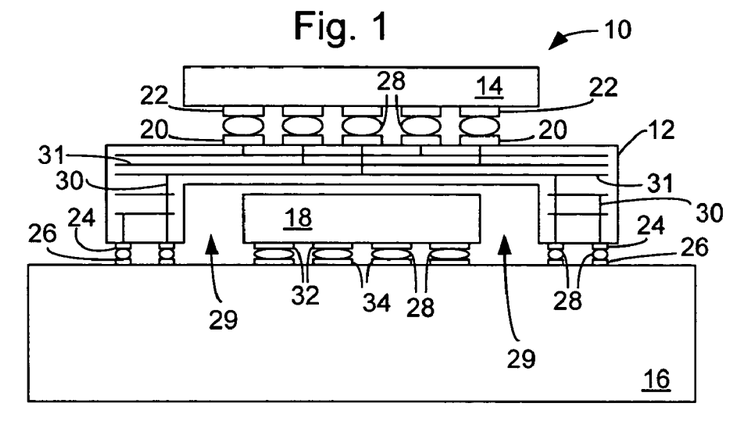
FIG. 1. is a side sectional view of a stack package for a high density memory module in accordance with the principles of the present invention.

Referring to FIG. 1, a stack package 10 for a high density IC module will now be described. Stack package 10 comprises an interposer 12, an IC 14 and a chip carrier 18 in electrical communication with a PCB 16. IC 14 may be an ASIC, such as a wireless communication signal base band processor. Chip carrier 18 may be a memory chip carrier 18. For purposes of illustration, IC 14 is discussed herein as an ASIC and chip carrier 18 is discussed as a memory chip carrier 18. The packaging and connecting methods and systems described herein can be used with other types of IC's and chips, such as, for example, general microprocessors and peripheral integrated circuits associated with ASIC's and microprocessors, such as digital signal processor, wireless communication transmit and receive chips. Additionally, many types of memory are possible, as will be described more fully below.

As seen in FIG. 1, memory chip carrier 18 is directly mounted on the PCB 16 and interposer 12 is disposed generally between the ASIC 14 and the PCB 16. Interposer 12 is preferably made from a sheet of dielectric material that does not experience significant thermal expansion or contraction and with a high glass transition temperature. The interposer is disposed between a pair of system components, wherein each system component includes a plurality of contact points, arranged in a linear or two-dimensional array. The interposer thereby provides the electrical connection between the contact points. Additional circuit elements may be stacked and electrically connected using additional interposers to create three-dimensional packages.

Interposer 12 includes a first surface including contact pads 20 that are arranged in a pattern complementary to that of contact pads 22 on the ASIC 14. On the opposite surface, interposer 12 has contact pads 24 arranged in a pattern complementary to that of contact pads 26 on the PCB 16. Solder balls are used to provide electrical and mechanical connections between interposer 12 and PCB 16. Interposer 12 further comprises metallic vias 30 that route electrical signals between contact pads 20, 24. Contact pads 20, 24 are arranged in different patterns such that vias 30 must route electrical signals between the PCB 16 and ASIC 14.

As shown in FIG. 1, interposer 12 further includes a space saving and height reduction cutout section 29. Memory chip carrier 18 is dimensioned to fit within cutout section 29 between the interposer and PCB, thereby providing a significant height reduction and space savings. Memory chip carrier 18 carries one or more memory chips including, but not limited to, random access memory (RAM), static random access memory (SRAM), dynamic random access memory (DRAM), Flash memory and other memory chips. Memory chip carrier 18 includes contact pads 32 that are in electrical communication with contact pads 34 on PCB 16 using solder balls 28.

Advantageously, interposer 12 allows a reduction in the PCB layer count, thereby providing a significant space and cost savings. Another advantage of using interposer 12 is that the lines between components (e.g., between the ASIC and memory) are shortened. Shorter lines account for faster times for functions between components and overall enhanced performance. Additionally, shorter lines provide a reduction in spurious electromagnetic radiation.

Further advantages of the interposer include: an increase in design flexibility since a change in a chip does not require a new layout of the entire main PCB, just the interposer; a reduction in product size; a lower processing cost; can utilize surface mount technology (SMT) with a few upgrades; expands the traditional two dimensional SMT process into a three dimensional process; much easier to create stack package than stack chips by wire bonding; can combine flip chip and SMT process; the stacking process can be completed in a single step reflow cycle; can be extended to different chips.

When stacking the individual substrates of stack package 10 onto PCB 16, each substrate is preferably dipped into a tacky flux before being placed onto the PCB or stacked onto another substrate. This process is repeated for all the substrates of the stack package. Then, the stacked package is sent through a reflow oven, thereby melting the solder paste and forming the solder joints. It may require only one pass through the reflow oven for the entire stacked package.

Some critical stacking process parameters include: the rigidity and flatness of the interposer board and chip carrier board; the solder ball height and uniformity; the flux type and tackiness; the flux dipping height; the flux dwell time, dipping time and throughput; placement force and speed during stacking; reflow and double side reflow.

Prevention of warping of the interposer is a critical factor. Accordingly, the interposer should be made of high Tg dielectric materials. Additionally, the thickness should be designed to reach the rigidity requirement. The process parameters are optimized through several designs of experiments (DOEs) that appear in Appendix A. It is found that a few milliseconds of dwell time during dipping and placement improved the yield, and the dipping height should be around 50%–75% of solder ball height. Pad size should be designed and calculated to prevent the drop off of the package during second side reflow.

Figure 2:
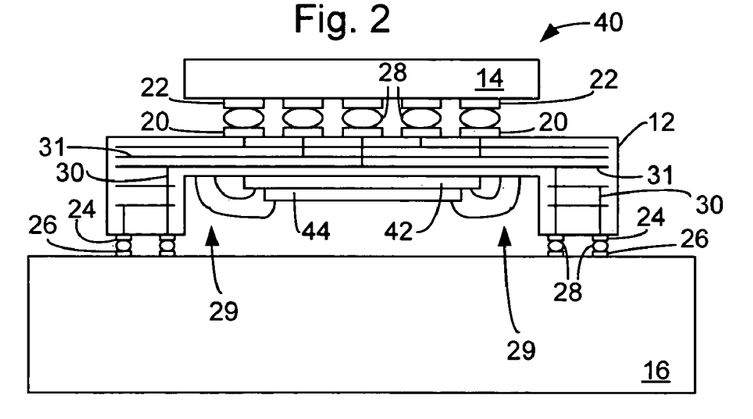
FIG. 2. is a side sectional view of a first alternative embodiment of a stack package for a high density memory module.

Referring to FIGS. 2–6, some alternative stack packages for high density memory modules according to the principles of the present invention will now be described. In FIGS. 2–6, elements similar to those of FIG. 1 have been numbered accordingly. As shown in FIG. 2, stack package 40 includes an interposer 12, an ASIC 14, a first memory chip 42 and a second memory chip 44. Similar to the previous embodiment, interposer 12 is disposed generally between the ASIC 14 and the PCB 16. Interposer 12 includes a first surface including contact pads 20 that are arranged in a pattern complementary to that of contact pads 22 on the ASIC 14 and a second, opposite surface including contact pads 24 arranged in a pattern complementary to that of contact pads 26 on the PCB 16. Vias 30 route electrical signals among the PCB 16 and ASIC 14 and memory chips 42, 44.

Interposer 12 further includes a space saving cutout and height reduction section 29 disposed on the first surface between contact pads 20. Memory chips 42, 44 are preferably disposed within cutout section 29 between the interposer 12 and PCB 16. Memory chips 42, 44 are wire bonded to the interposer 12 within cutout section 29 such that they are in electrical communication with the PCB 16 and ASIC 14, and then the whole cutout section is molded with epoxy. According to some embodiments, memory chip 42 is a Flash memory chip and memory chip 44 is an SRAM chip. Of course, as would be understood by those of ordinary skill in the art, memory chips 42, 44 may comprise numerous other types of chips without departing from the scope of the present invention.

Figure 3:
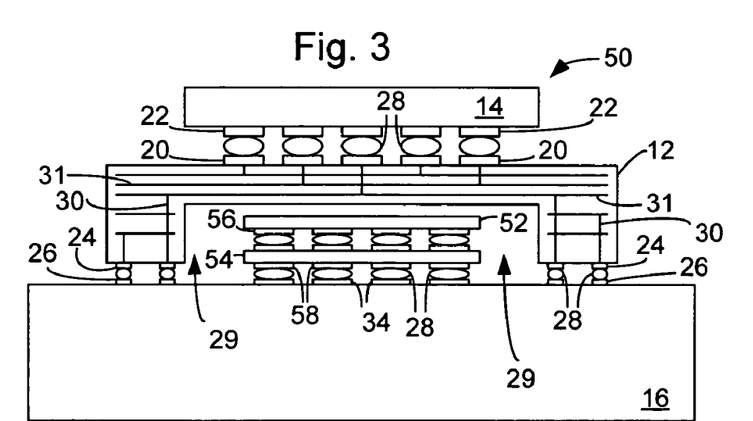
FIG. 3. is a side sectional view of a second alternative embodiment of a stack package for a high density memory module.
Figure 4:
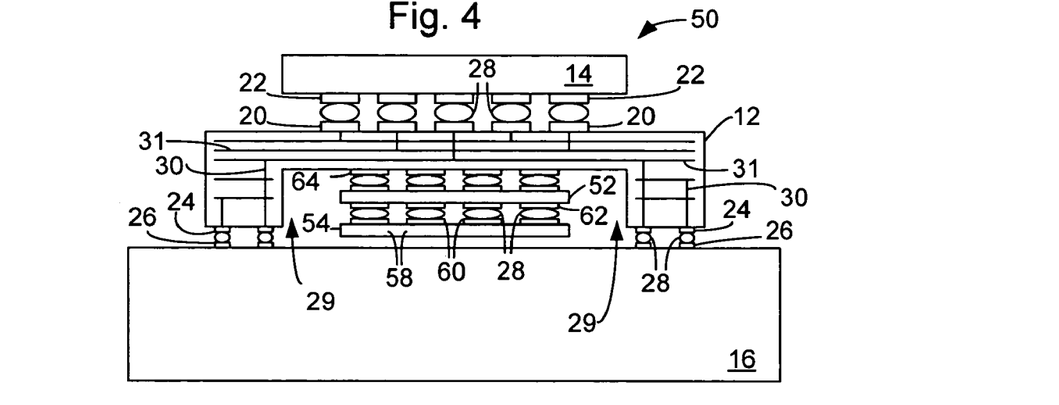
FIG. 4. is a side sectional view of a third alternative embodiment of a stack package for a high density memory module.

Referring to FIGS. 3 and 4, stack package 50, 60 each include an interposer 12, an ASIC 14, a first memory chip 52 and a second memory chip 54. Similar to previous embodiments, interposer 12 is disposed generally between the ASIC 14 and the PCB 16. Interposer 12 includes a first surface including contact pads 20 that are arranged in a pattern complementary to that of contact pads 22 on the ASIC 14 and a second, opposite surface including contact pads 24 arranged in a pattern complementary to that of contact pads 26 on the PCB 16. Vias 30 route electrical signals among the PCB 16 and ASIC 14 and memory chips 52, 54.

Memory chips 52, 54 are disposed within space saving cutout section 29 between the interposer 12 and PCB 16. In the stack package 50 of FIG. 3, memory chip 54 is mounted directly to PCB 16 and memory chip 52 is stacked on top of memory chip 54. More particularly, memory chip 52 includes contact pads 56 arranged in a pattern complementary to that of contact pads 58 on memory chip 54, which are arranged in a pattern complementary to that of contact pads 26 on the PCB 16. By contrast, in the stack package 60 of FIG. 4, memory chip 52 is mounted directly to interposer 12 and memory chip 54 is stacked on the bottom of memory chip 52. In this embodiment, memory chip 54 includes contact pads 60 arranged in a pattern complementary to that of contact pads 62 on memory chip 52, which are arranged in a pattern complementary to that of contact pads 64 on the interposer 12. Alternatively, only one chip, such as memory chip 52 is disposed within space saving cutout section 29. For example, memory chip 54, need not be present. In still another alternative, memory chips 52 and 54 could be disposed adjacent to each other, rather than stacked one over the other.

Figure 5:
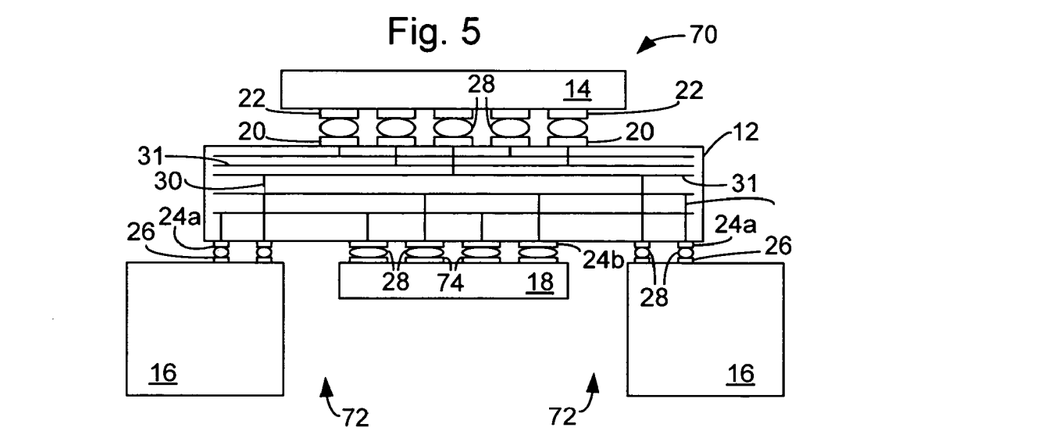
FIG. 5. is a side sectional view of a fourth alternative embodiment of a stack package for a high density memory module.

Referring to FIG. 5, stack package 70 includes an interposer 12, an ASIC 14 and a memory chip carrier 18. Similar to the previous embodiments, interposer 12 is disposed generally between the ASIC 14 and the PCB 16. However, unlike previous embodiments, interposer 12 does not include a space saving cutout section 29. Instead, PCB 16 includes a central cutout section 72, wherein memory chip carrier is dimensioned to fit within the cutout section 72, thereby providing a significant space savings. Memory chip carrier 18, which carries one or more memory chips including, but not limited to, RAM, SRAM, DRAM, Flash memory and other memory chips, is mounted directly to the interposer 12.

Interposer 12 includes a first surface including contact pads 20 that are arranged in a pattern complementary to that of contact pads 22 on the ASIC 14. Additionally, interposer 12 includes a second, opposite surface including: contact pads 24a arranged in a pattern complementary to that of contact pads 26 on the PCB 16; and (2) contact pads 24b arranged in a pattern complementary to that of contact pads 74 on memory carrier 18. Vias 30 route electrical signals among the PCB 16 and ASIC 14 and memory chip carrier 18.

Figure 6:
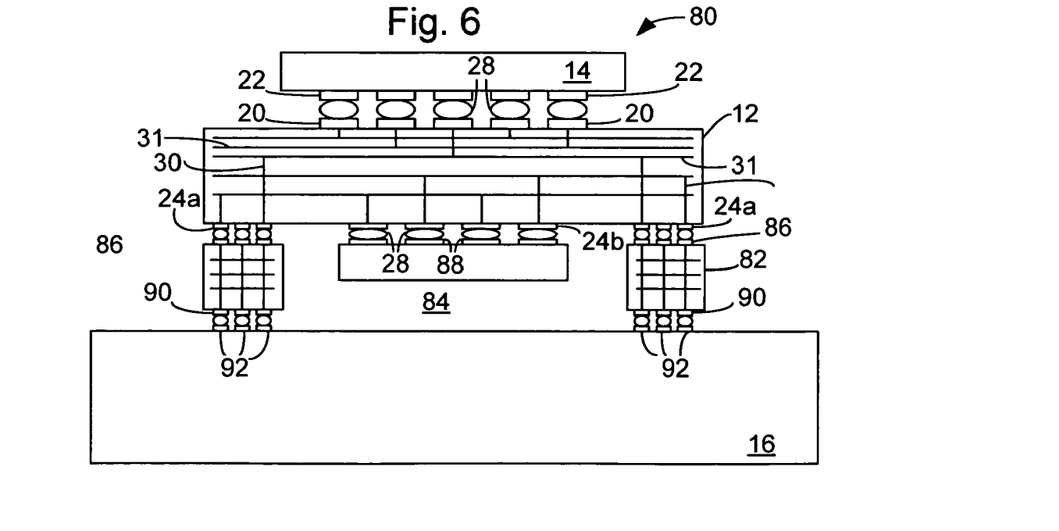
FIG. 6. is a side sectional view of a fifth alternative embodiment of a stack package for a high density memory module.

Referring to FIG. 6, stack package 80 includes a first interposer 12, an ASIC 14, a memory chip carrier 18 and a second interposer 82 having a central cutout section 84. First interposer 12 is disposed generally between the ASIC 14 and the second interposer 82, which is disposed generally between the first interposer 12 and the PCB 16. Memory chip carrier 18 carries one or more memory chips, such as including, RAM, SRAM, DRAM, Flash memory and other memory chips Interposer 12 includes a first surface including contact pads 20 that are arranged in a pattern complementary to that of contact pads 22 on the ASIC 14. Additionally, interposer 12 includes a second, opposite surface including: (1) contact pads 24a arranged in a pattern complementary to that of contact pads 86 on interposer 82; and (2) contact pads 24b arranged in a pattern complementary to that of contact pads 88 on the memory chip carrier 18. Vias 30 route electrical signals among the PCB 16 and ASIC 14 and memory chip carrier 18.

As shown in FIG. 6, memory chip carrier 18 is dimensioned to fit within cutout section 84, thus providing the desired space savings and height reduction. Interposer 82 includes a first surface including contact pads 86 arranged in a pattern complementary to that of contact pads 24a on interposer 12 and a second surface including contact pads 90 arranged in a pattern complementary to that of contact pads 92 on PCB 16.

Preferred Method for Assembling a Stack Package

Conventional SMT assembly involves only one level of components placed directly on the PCB. By contrast, 3-D stacking is a complex process that involves a vertical stacking dimension in addition to the conventional 2-D SMT assembly. The present invention combines conventional SMT technology with a flux application technique. The bottom component of the stack package may be placed onto the PCB using conventional SMT principles, whereas additional components are dipped into a rotary fluxer and stacked on top of the bottom component. The stack die package of the present invention allows for reduced phone size, as well as enhanced capacity and functionality. In addition, the stack die package provides increased design flexibility and permits a reduction in PCB layer count and cost. A further advantage of the stack die package of the present invention is that it requires less capital equipment investment and upgrade than conventional flip chips.

Figure 7:
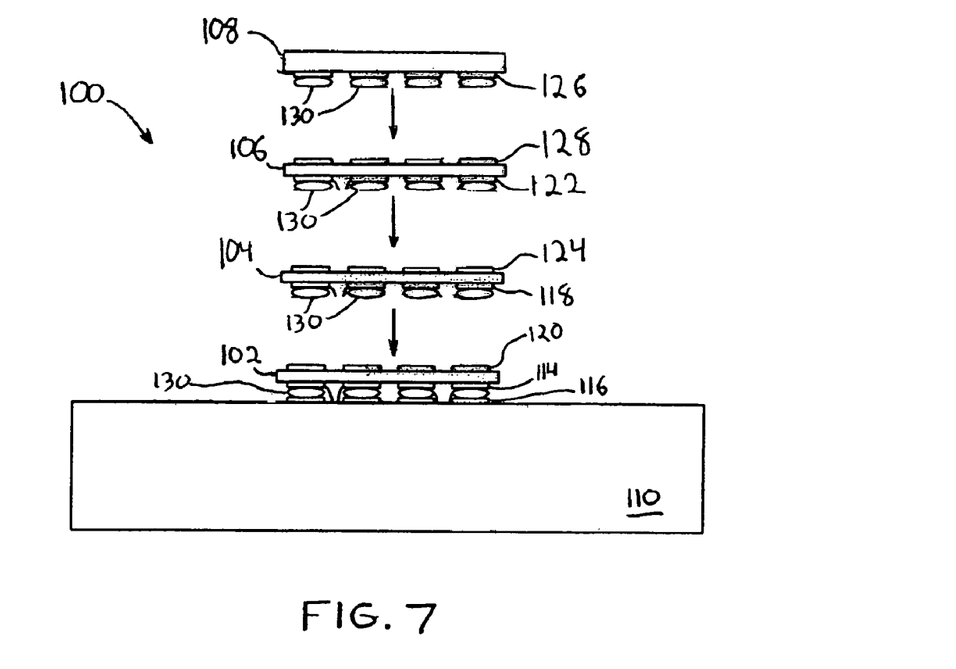
FIG. 7 is a partially exploded side sectional view depicting a preferred method of assembling a stack package on a PCB in accordance with the principles of the present invention.

As depicted in FIG. 7, a stack package 100 for a high density IC module comprises a plurality of stack package layers 102, 104, 106, 108 provided in electrical communication with PCB 110. Each stack package layer 102, 104, 106, 108 comprises a functional chip, an interposer board or a chip carrier. According to a preferred implementation, layer 102 comprises a first chip carrier, layer 104 comprises a second chip carrier, layer 106 comprises an interposer and layer 108 comprises an IC. By way of example, stack package layer 108 may comprise an ASIC, such as a wireless communication signal base band processor.

Stack package layers 104, 106 may comprise memory chip carriers. These memory chip carriers are adapted to carry one or more memory chips including, but not limited to, random access memory (RAM), static random access memory (SRAM), dynamic random access memory (DRAM), Flash memory and other memory chips. According to some embodiments, one of the first two stack package layers is eliminated such that only one chip carrier is provided in the stack package. For purposes of illustration, stack package layer 108 is discussed herein as an ASIC and stack package layers 104, 106 are discussed herein as memory chip carriers. As would be appreciated by those of skill in the art, the packaging and connecting methods described herein can be used with other types of IC's and chips, such as, for example, general microprocessors and peripheral integrated circuits associated with ASIC's and microprocessors, such as digital signal processor, wireless communication transmit and receive chips, without departing from the scope of the present invention.

With continued reference to FIG. 7, layer 102 is directly mounted on the PCB 110, layer 104 is mounted on layer 102, layer 106 is mounted on layer 104, and layer 108 is mounted on layer 106. More particularly, layer 102 includes contact pads 114 that are arranged in a pattern complementary to that of contact pads 116 on the PCB 110, layer 104 includes contact pads 118 that are arranged in a pattern complementary to that of contact pads 120 on layer 102, layer 106 includes contact pads 122 that are arranged in a pattern complementary to that of contact pads 124 on layer 104, and layer 108 includes contact pads 126 that are arranged in a pattern complementary to that of contact pads 128 on layer 106. Solder balls 130 are used to provide electrical and mechanical connections between the contact pads of adjacent layers.

Figure 8:
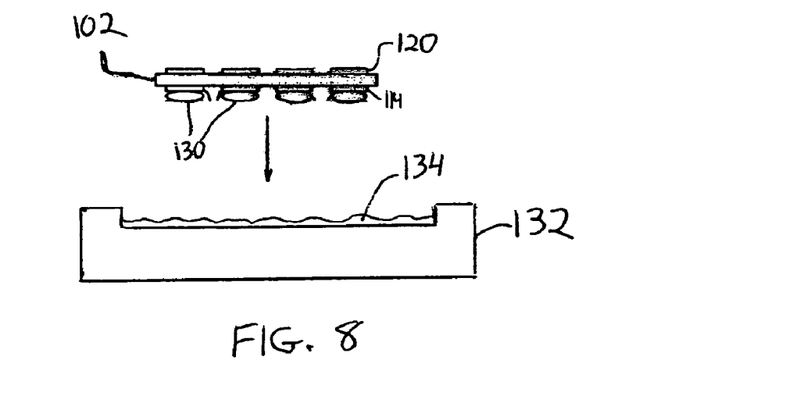
FIG. 8 is a side sectional view depicting a stack module layer of the present invention being dipped into a flux reservoir.

Referring to FIG. 8, the bottom layer 102 of stack package 100 is preferably dipped into a reservoir 132 containing a tacky flux 134 before being placed onto the PCB 110. More particularly, the solder balls 130 attached to the bottom surface of layer 102 are dipped into the flux. Similarly, layer 104 is dipped into the reservoir 132 before being stacked onto layer 102. This stacking process is repeated for all the layers of the stack package. Preferably, the stacking process is fully automated, such that a mechanical device is employed to sequentially pick up each layers, dip the layer in the flux and place the layer onto the PCB 110 or previous layer. For example, the automated substrate dipping and placement device may comprise a Siemens F5 pick and placement machine equipped with a rotary fluxer for flux application.

After the stack package 100 has been assembled, it is passed through a reflow oven, thereby melting the solder paste and forming the solder joints. It may require only one pass through the reflow oven for the entire stacked package. Some critical stacking process parameters include: the rigidity and flatness of the interposer board(s) and chip carrier board(s); the solder ball height and uniformity; the flux type and tackiness; the flux dipping height; the flux dwell time, dipping time and throughput; placement force and speed during stacking; reflow and double side reflow.

Similar to previous embodiments, the interposer layer (e.g., layer 106) of the stack package is preferably made from a sheet of dielectric material that includes a high glass transition temperature and does not experience significant thermal expansion, thermal contraction and/or warpage. The interposer provides the electrical connection between a pair of stack package layers. Additional circuit elements may be stacked and electrically connected to the stack package utilizing additional interposers, without departing from the scope of the present invention. According to some embodiments of the present invention the interposer may comprise a cutout section 29, such as disclosed with respect to the embodiment of FIG. 1, wherein a memory chip carrier is dimensioned to fit within the cutout section, thereby providing a significant height reduction and space savings.

Referring again to FIG. 7, the stack die package 100 preferably comprises three to five different chip scale package (CSP) components comprising thin PCB carriers, interposers and/or functional chips that are stacked on the same location of the PCB 110. Each component may comprise a 0.25 mm thick BT or FR-5 PCB with an array solder bumps disposed on the bottom surface, similar to a ball grid array (BGA) format. According to a preferred implementation, solder bump diameter is 0.3 mm with a 0.5 mm pitch.

In order to develop the preferred 3-D stack die package of the present invention, many studies involving stack ASIC packaging have been conducted. The studies involved successful stacking of both daisy chained and functional stacking modules (memory+ASIC), which are assembled on functional test phones. Factors that were considered in developing preferred processes include process development, stacking module design impact on stacking process, design for assembly (DFM) issues, reliability tests results (e.g., thermal shock), and failure test results. The resultant preferred stack die package features a reduced PCB layer count that results in reduced handset size and improved design flexibility. The preferred processes combine flip chip technology and surface mount technology, and also transcend traditional 2-D assembly into 3-D assembly.

During testing, a screening was conducted to determine a preferred interposer board and a preferred tacky flux (see Appendix A). Three different tacky fluxes (A, B and C) from diverse vendors, and three different interposers (1, 2 and 3) having variable thickness and materials (FR5 and BT) were tested and compared during the screening DOE. Flux A and interposer 1 generated the best results, and thus were chosen for further testing. A critical index for interposer evaluation is warpage level. Warpage of interposer needs to be maintained at a low level in order to achieve robust solder joints and structure. Critical indices for flux evaluation include tackiness, flux activities and residue. Critical indices for module design and stacking processes include interposer board rigidity and flatness, as well as solder ball height uniformity.

In operation, process parameters to be considered during stacking include, but are not limited to: (1) flux height; (2) dwell time; (3) force of placement: (4) dipping time; (5) and placement speed. Precise control of these variables is vital for the structural and electronic viability of the resulting circuit board. In view of the above, a further process DOE and confirmation test were conducted to optimize the process parameters (see Appendix A). Dipper flux height is a critical process parameter since increased flux height results in improved wettability. In particular, flux height preferably is at about 40% of total solder ball height. Actual flux wetting was measured using a dipping height of 160 microns, wherein the actual flux wetting height on the solder balls was approximately 0.118 mm (about 38% of total solder ball height).

Dwell time and dipping time are process parameters that affect wettability, although dipping time is the most significant contributor. More particularly, longer dwell and/or dipping times result in increased wettability, but also result in increased cycle time. Thus, a balance must be compromised between wettability and cycle time. By increasing flux height, dipping time and dwell time may be reduced without adversely affecting wettability (see process setting 3 in confirmation DOE in Appendix A). Acceleration does not appear to affect wettability.

Figure 9:
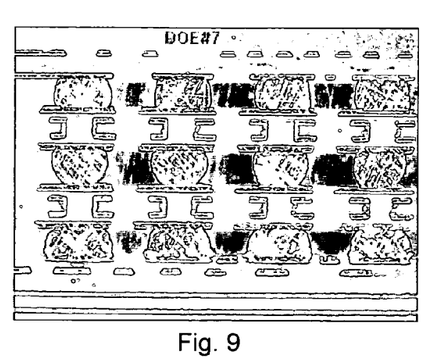
FIG. 9 is a side sectional view of a stack package having insufficiently wetted solder joints formed using very short dipping times.
Figure 10:
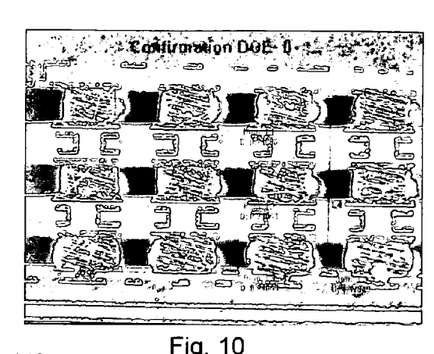
FIG. 10 is a side sectional view of a stack package having sufficiently wetted solder joints formed using longer dipping times.

FIG. 9 is a side sectional view of a stack package having insufficiently wetted solder joints formed using very short dipping times. The resulting solder joint shapes are irregular and inconsistent. FIG. 10 is a cross-sectional view of a stack package having sufficiently wetted solder joints formed using longer dipping times. The resulting solder joint shapes are more consistent and even.

Figure 11:
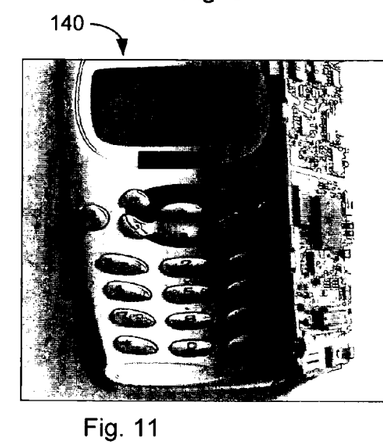
FIG. 11 is a perspective view of a testing phone featuring a stack package constructed in accordance with the principles of the present invention.
Figure 12:
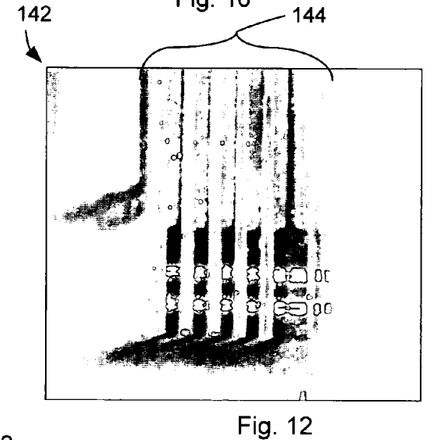
FIG. 12 is a side sectional view of a testing phone featuring a stacked daisy chain stacking module constructed in accordance with the principles of the present invention.

Reliability testing of the present invention involved two different stacking modules and test vehicles. Referring to FIG. 11, test vehicle 140 comprises a functional testing phone, wherein stacking module size is about 15×15 mm, pitch is about 0.8 mm and solder ball diameter is about 0.4 mm. The 0.8 mm pitch stacking module demonstrated good reliability results. Referring to FIG. 12, test vehicle 142 comprises a testing phone including a stacked daisy chain module 144, wherein stacking module size is about 9×14 mm, pitch is about 0.5 mm and solder ball diameter is about 0.3 mm. Two different stacking modules designs were tested using vehicle 142, specifically solder mask defined stacking modules and a combination of etching and solder mask defined stacking modules.

The format used for a first series of reliability testing of test vehicle 140 included: (1) a thermal shock test (from −40° C. to 85° C. for 12 cycles); (2) a half energy drop test (0.75 m); (3) a temperature humidity cycling test (85% relative humidity for 504 hours); and (4) another half energy drop test (0.75 m). The format used for a second series of reliability testing of test vehicle 140 included: (1) a keypad punch test; and (2) a full energy drop test (1.5 m drop). Electrical demonstration tests were conducted and verified before and after both series of reliability testing. Stacking modules on test vehicle #1 passed all the above reliability tests.

Test vehicle 142 was put through a thermal shock test from −25° C. to 125° C. for 500 cycles. Both solder mask defined stacking modules and a combination of etching and solder mask defined stacking modules were tested with the following results. Seven out of eight solder mask defined stacking modules failed 500 cycles, whereas two out of eight combination stacking modules failed 500 cycles. Thermal expansion differences between solder mask and solder joint is considered to be the root cause of the failures. In particular, the differences in thermal expansion properties introduces an extra stress point during thermal shock cycles.

Figure 13:
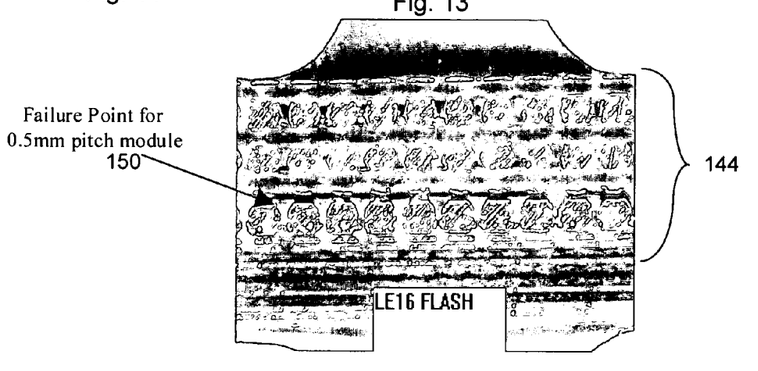
FIG. 13 is a side sectional view of the testing phone of FIG. 12 depicting the failure mode of the daisy chain stacking module after the completion of thermal shock testing.

FIG. 13 shows the failure mode of the 0.5 mm daisy chain stacking module 144 with solder mask defined pads after the completion of thermal shock testing. The crack 150 initiated at the interface between the bottom solder joint and the carrier, and then quickly propagated across the entire module. An improved functional module with modified pad structure and layout was designed to resolve the thermal shock failure issues pertaining to the 0.5 mm stacking module.

Thus, it is seen that methods for assembling a stack package for a high density IC module on a PCB are provided. One skilled in the art will appreciate that the present invention can be practiced by other than the various embodiments and preferred embodiments, which are presented in this description for purposes of illustration and not of limitation, and the present invention is limited only by the claims that follow. It is noted that equivalents for the particular embodiments discussed in this description may practice the invention as well.

APPENDIX A: STACKING PROCESS DOE REPORT

I. Screening DOE:
  A. Flux
  1. Heraeus TF36 no clean tacky flux
  2. Kester no clean tacky TSF 6522
  B. Interposer Board
  1. BT 0.28 mm thickness
  2. FR 5 0.36 mm thickness
  C. Process Settings
  1. Dwell time=1 sec, dipping time=1 sec, acceleration speed=50
  2. Dwell time=3 sec, dipping time=2 sec, acceleration speed=20
  3. Dwell time=5 sec, dipping time=0.5 sec, acceleration speed=10
  D. Reballing process
  1. 16 mil Alpha solder ball
  2. Heraeus SF33 no clean tacky flux
  3. Ball height mean=0.31 mm (standard deviation=0.007)
  E. Test vehicle
  1. K1 bare board with typical K1 reflow profile
  2. Top and bottom of SMM temperature difference is negligible.
  F. Results Summary
  1. FR5 0.36 mm board has much less warpage than BT 0.28 mm.
  2. Both flux have good wetting
  3. Heraeus no clean flux has less visible residue than Kester's
  4. Process settings 1 and 2 achieved better wetting than process setting 3
  5. FR5 and Heraeus TF36 flux are chosen for formal DOE Run II. Process DOE
  A. 15 experiments were designed for 3 factors/3 levels
  1. Dwell time=1.0 sec, 2.0 sec, 3.0 sec
  2. Dipping time=0.5 sec, 1.5 sec, 2.0 sec
  3. Acceleration speed=10, 30, 50
  4. Dipping height=maximum of 75 microns
  5. Dipping and placement force=default of 3.1 grams III. Confirmation DOE
  A. Dipping height is increased to 150–160 microns to compensate for solder ball height variance and nozzle flatness
  B. Dipping and placement force is also increased to 5 grams
  C. Process settings
  1. Dipping time=0.5 sec, dwell time=0.5 sec, flux height=150 microns
  2. Dipping time=1.5 sec, dwell time=2 sec, flux height=150 microns
  3. Dipping time=0.5 sec, dwell time=0.5 sec, flux height=160 microns
  4. Dipping time=1.5 sec, dwell time=2 sec, flux height=160 microns
  D. Results Summary
  1. Process settings 2, 3 and 4 exhibited good wetting
  2. Process setting 1 did not exhibit good wetting

What is claimed is:

1. A method for assembling a stack package on a printed circuit board (PCB), the method comprising the steps of:
  assembling at least one first layer of the stack package on the PCB;
  assembling an interposer of the stack package on the PCB and above the at least one first layer, wherein the at least one first layer is positioned within a cut out section on a first surface of the interposer; and
  assembling an integrated circuit of the stack package on a second surface of the interposer;
  wherein the interposer provides at least one electrical connection between the integrated circuit and the PCB.

2. The method of claim 1, wherein a tacky flux is used to adhere the at least one first layer and the interposer to the PCB and to adhere the integrated circuit to the interposer in the assembling steps, the method further comprising the step of passing the PCB and the assembled stack package through a reflow oven to form a plurality of solder joints between the integrated circuit and the interposer, between the interposer and the PCBl and between the at least one first layer and the PCB.

3. The method of claim 1, wherein:
  the at least one first layer comprises a chip carrier.

4. The method of claim 1, wherein the at least one first layer comprises a memory chip carrier.

5. The method of claim 4, wherein the memory chip carrier is structured to carry a Flash memory and an SRAM.

6. The method of claim 1, wherein the at least one first layer is a plurality of stacked memory chip carriers.

7. A method for assembling a stack package on a printed circuit board (PCB), the method comprising the steps of:
  assembling at least one memory layer within a cut out section on a lower surface of an interposer layer;
  assembling the lower surface of the interposer layer of the stack package on a first surface of the PCB; and
  assembling at least one third layer of the stack package on an upper surface of the interposer layer;
  wherein the interposer layer provides an electrical connection between the at least one third layer and the PCB.

8. The method of claim 1, wherein a tacky flux is used to adhere the at least one memory layer to the interposer layer, to adhere the at least one third layer to the interposer layer and to adhere the interposer layer to the PCB in the assembling steps, the method further comprising the step of passing the PCB and the assembled stack package through a reflow oven to form a plurality of solder joints between the third layer and the interposer layer, between the interposer layer and the PCB, and between the at least one memory layer and the interposer layer.

9. The method of claim 7, wherein:
the at least one memory layer comprises at least one memory chip carrier.

10. The method of claim 7, wherein the at least one third layer is an integrated circuit (IC).

11. The method of claim 9, wherein the at least one memory chip carrier carries a Flash memory and an SRAM.

12. The method of claim 7, wherein the the at least one third layer comprises an ASIC.

13. The method of claim 7, wherein the at least one memory layer is a plurality of stacked memory chip carriers.

14. A method for assembling a stack package for a high density IC module on a circuit board, the method comprising the steps of:
dipping at least one first layer of the stack package in a flux reservoir of tacky flux;
assembling the at least one first layer on the circuit board, wherein the tacky flux adheres the at least one first layer to the circuit board;
dipping a second layer of the stack package in the flux reservoir;
assembling the second layer on the circuit board and above the at least one first layer, wherein the at least one first layer is positioned within a cut out section on a bottom surface of the second layer, wherein the tacky flux adheres the second layer to the circuit board;
dipping at least one third layer of the stack package in the flux reservoir; and
assembling the at least one third layer on a top surface of the second layer, wherein the tacky flux adheres the at least one third layer to the second layer.

15. The method of claim 14, wherein the step of assembling the at least one first layer comprises assembling the at least one first layer within the cut out section on the bottom surface of the second layer.

16. The method of claim 15, wherein the at least one first layer is a plurality of memory chip carriers, further comprising the steps of dipping each of the memory chip carriers of the plurality of memory chip carriers in the flux reservoir and assembling the plurality of memory chip carriers in a memory stack configuration on the circuit board and within the cut out section.

17. The method of claim 15, wherein the second layer is an interposer constructed of a dielectric material, the interposer having at least one metallic via for electrically connecting the circuit board to the at least one third layer.

18. The method of claim 14, further comprising the step of passing the stack package through a reflow oven after the stack package is assembled.

* * * * *